(12) United States Patent
Babich et al.

(10) Patent No.: US 7,326,442 B2
(45) Date of Patent: Feb. 5, 2008

(54) ANTIREFLECTIVE COMPOSITION AND PROCESS OF MAKING A LITHOGRAPHIC STRUCTURE

(75) Inventors: Katherina E. Babich, Chappaqua, NY (US); Sean D. Burns, Hopewell Junction, NY (US); Elbert E. Huang, Tarrytown, NY (US); Arpan P. Mahorowala, Bronxville, NY (US); Dirk Pfeiffer, Dobbs Ferry, NY (US); Karen Temple, Toronto (CA)

(73) Assignee: International Business Machines Corporation, Armonk, NY (US)

( * ) Notice: Subject to any disclaimer, the term of this patent is extended or adjusted under 35 U.S.C. 154(b) by 229 days.

(21) Appl. No.: 11/180,788

(22) Filed: Jul. 14, 2005

(65) Prior Publication Data

US 2007/0015083 A1    Jan. 18, 2007

(51) Int. Cl.
G03F 7/00 (2006.01)
B32B 9/04 (2006.01)

(52) U.S. Cl. .............. 427/534; 427/466; 427/508; 216/74; 430/270.1; 430/272.1; 430/396; 428/447; 428/448; 528/25; 528/43

(58) Field of Classification Search .............. None
See application file for complete search history.

(56) References Cited

U.S. PATENT DOCUMENTS

| | | | |
|---|---|---|---|
| 4,273,420 A * | 6/1981 | Watanabe et al. | 428/1.23 |
| 4,557,797 A | 12/1985 | Fuller et al. | |
| 5,668,237 A * | 9/1997 | Popall et al. | 528/9 |
| 6,218,078 B1 | 4/2001 | Iacoponi | |
| 6,268,457 B1 | 7/2001 | Kennedy et al. | |
| 6,410,209 B1 | 6/2002 | Adams et al. | |
| 6,420,088 B1 | 7/2002 | Angelopoulos et al. | |
| 6,503,689 B2 | 1/2003 | Zampini et al. | |
| 6,503,692 B2 | 1/2003 | Angelopoulos et al. | |
| 6,638,851 B2 | 10/2003 | Cowley et al. | |
| 6,653,048 B2 | 11/2003 | Brock et al. | |
| 6,660,645 B1 | 12/2003 | Bell et al. | |
| 6,686,124 B1 | 2/2004 | Angelopoulos et al. | |
| 6,730,454 B2 | 5/2004 | Pfeiffer et al. | |
| 2002/0052125 A1 | 5/2002 | Shafer et al. | |
| 2002/0195419 A1 | 12/2002 | Pavelcheck | |
| 2005/0274692 A1 | 12/2005 | Iwabuchi et al. | |
| 2005/0277058 A1 | 12/2005 | Hamada et al. | |
| 2005/0277755 A1 | 12/2005 | Iwabuchi et al. | |
| 2005/0277756 A1 | 12/2005 | Hamada et al. | |

* cited by examiner

*Primary Examiner*—Marc S. Zimmer
(74) *Attorney, Agent, or Firm*—Connolly Bove Lodge & Hutz LLP; Daniel P. Morris

(57) ABSTRACT

An antireflective composition and a lithographic structure comprising a silicon-metal oxide, antireflective material derived from the composition. The antireflective composition comprises a polymer of formula I,

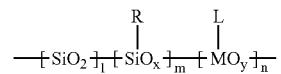

wherein $1 \leq x \leq 2$; $1 \leq y \leq 5$; $1 \geq 0$; $m > 0$; $n > 0$; R is a chromophore, M is a metal selected from Group IIIB to Group VIB, lanthanides, Group IIIA, Group IVA except silicon; and L is an optional ligand. The invention is also directed to a process of making a lithographic structure including a silicon-metal oxide, antireflective material.

24 Claims, No Drawings

ANTIREFLECTIVE COMPOSITION AND PROCESS OF MAKING A LITHOGRAPHIC STRUCTURE

FIELD OF INVENTION

The invention relates to an antireflective composition used in lithography, and a process of making a lithographic structure from the antireflective composition.

BACKGROUND OF THE INVENTION

In the process of making semiconductor devices photoresists and antireflective materials are applied to a substrate. Photoresists are photosensitive films used to transfer an image to a substrate. A photoresist is formed on a substrate and then exposed to a radiation source through a photomask (reticle). Exposure to the radiation provides a photochemical transformation of the photoresist, thus transferring the pattern of the photomask to the photoresist. The photoresist is then developed to provide a relief image that permits selective processing of the substrate.

Photoresists are typically used in lithographic structures to create features such as vias, trenches or combination of the two, in a dielectric material. In such a process, the reflection of radiation during exposure of the photoresist can limit the resolution of the image patterned in the photoresist due to reflections from the material beneath the photoresist. Reflection of radiation from the substrate/photoresist interface can also produce variations in the radiation intensity during exposure, resulting in non-uniform linewidths. Also, unwanted scattering of radiation expose regions of the photoresist not intended, which again results in linewidth variation. The amount of scattering and reflection will vary from one region of the substrate to another resulting in further linewidth variation.

With recent trends towards high-density semiconductor devices, there is a movement in the industry to use low wavelength radiation sources into the deep ultraviolet light (300 nm or less) for imaging a photoresist, e.g., KrF excimer laser light (248 nm), ArF excimer laser light (193 nm), excimer laser light (157 nm), electron beams and soft x-rays. However, the use of low wavelength radiation often results in increased reflections from the upper resist surface as well as the surface of the underlying substrate.

Substrate reflections at ultraviolet and deep ultraviolet wavelengths are notorious for producing standing wave effects and resist notching which severely limit critical dimension (CD) control. Notching results from substrate topography and non-uniform substrate reflectivity which causes local variations in exposure energy on the resist. Standing waves are thin film interference or periodic variations of light intensity through the resist thickness. These light variations are introduced because planarization of the resist presents a different thickness through the underlying topography. Thin film interference plays a dominant role in CD control of single material photoresist processes, causing large changes in the effective exposure dose due to a tiny change in the optical phase. Thin film interference effects are described in "Optimization of optical properties of resist processes" (T. Brunner, SPIE 10 Proceedings Vol. 1466, 1991, 297).

Bottom anti-reflective coatings (BARCs) have been used with photoresists to reduce thin film interference with some success. However, these relatively thin absorbing BARCs have fundamental limitations. At times, the photoresist does not provide sufficient resistance to subsequent etching steps to enable effective transfer of the desired pattern to a material, e.g., a dielectric, beneath the photoresist. The photoresist is consumed after transferring the pattern into the underlying BARC and substrates. In addition, the trend to smaller sub 90 nm node feature sizes requires the use of relatively thin photoresists (>200 nm) to avoid image collapse. If a substantial etching depth is required, or if it is desired to use certain etchants for a given underlying material, the photoresist thickness is now insufficient to complete the etch process. Consequently, the photoresist does not effectively transfer the desired pattern into the underlying substrate or antireflective material.

The present trend to 248 nm, 193 nm and 157 nm lithography and the demand for sub 200 nm features requires that new processing schemes be developed. To accomplish this, tools with higher numerical aperture (NA) are emerging. The higher NA allows for improved resolution but reduces the depth of focus of aerial images projected onto the photoresist. Because of the reduced depth of focus, a thinner photoresist is required. However, as the thickness of the photoresist is decreased, the photoresist becomes less effective as a mask for subsequent dry etch image transfer to the underlying substrate. Without significant improvement in the etch resistance exhibited by current single material photoresists, these systems cannot provide the necessary etch characteristics for high resolution lithography.

SUMMARY OF THE INVENTION

The invention is directed to a composition comprising a polymer of formula I,

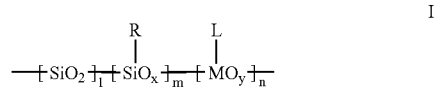

wherein $1 \leq x \leq 2$; $1 \leq y \leq 5$; $1 \geq 0$; $m>0$; $n>0$; R is a chromophore, M is a metal selected from Group IIIB to Group VIB, lanthanides, Group IIIA, Group IVA except silicon; and L is an optional ligand.

The composition is typically used to form an antireflective material used in lithography. In particular, the antireflective material is used to pattern an underlying substrate, particularly, in high resolution lithography using low wavelength radiation sources into the deep ultraviolet to soft x-rays.

DETAILED DESCRIPTION OF THE INVENTION

To address many of the semiconductor processing issues summarized in the "Background of the Invention", applicants have developed an antireflective composition that is well suited for high resolution lithography. For example, if the underlying substrate to be patterned is relatively thick, and a substantial etching depth is required, specific etchants in combination with the antireflective material will facilitate the pattern transfer. The antireflective material positioned between the photoresist and the substrate to be pattered would receive the pattern from the photoresist followed by the transfer of the pattern to the underlying substrate. The antireflective material is better suited to withstand the etching processes needed to etch the underlying substrate.

The invention is directed to a composition comprising a polymer of formula I,

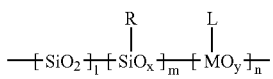

I wherein $1 \leq x \leq 2$; $1 \leq y \leq 5$; $1 \geq 0$; m<0; n>0; R is a chromophore, M is a metal selected from Group IIIB to Group VIB, lanthanides, Group IIIA, Group IVA except silicon; and L is an optional ligand. The polymer of formula I can also comprise an organic transparent group T attached to the silicon backbone as follows.

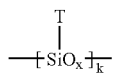

wherein k>0 and T is an organic transparent group substantially transparent to 248 nm, 193 nm or 157 nm radiation.

The $SiO_x$ group is a siloxane structure, a silsesquioxane structure, or a mixture thereof. The silsesquioxane-type polymers will often have superior etch resistance. Still, if the organosiloxane-type polymers are used the degree of crosslinking is generally increased compared to formulations based on silsesquioxanes. In many cases, the polymer composition will have solution and film-forming characteristics conducive to forming a material by conventional spin-coating.

The $-MO_y-$ polymeric unit can be any one of many different metal-oxide forms. An exemplary list of such metal-oxide forms for a particular metal is as follows:

1. $-MO_3-$; wherein M is Sc, Y, lanthanide, and Group IIIA; B, Al, Ga or In.
2. $-MO_4-$; wherein M is Group IVB; Ti, Zr or Hf, and Group IVA; Sn or Ge.
3. $-MO_5-$; wherein M is Group VB; V, Nb or Ta; or P. The Group VB metals are also known to form stable metal oxo forms, $LMO_3$, wherein L is an oxo.
4. -LMO—; many of the listed metals form stable acetoacetato-metal complexes.
5. -LMO—; many of the listed metals form stable cyclopentadienyl-metal complexes.
6. -LMO—; wherein L is an alkoxy ligand; M is Sc, Y, or lanthanide, Group IVB, and Group VB
7. -LMO—; wherein L is an alkyl or phenyl ligand; M is Group IIIA or Group IVA.

The silicon-metal oxide polymer of Formula I comprises from about 2 at % to about 40 at % of the metal M, from about 3 at % to about 15 at % of silicon, and from about 12 at % to about 30 at % of oxygen based on the total atomic percent composition.

In one embodiment, the silicon-metal oxide polymer of Formula I comprises from about 16 at % to about 30 at % of the metal M, from about 3 at % to about 10 at % of silicon, and from about 15 at % to about 25 at % of oxygen based on the total atomic percent composition.

An exemplary list of metals that exhibit certain advantages include the metals of Group IVB (titanium, zirconium and hafium), Group VB (vanadium, niobium and tantalum) or germanium.

The silicon-metal oxide polymer of general Formula I, prior to crosslinking, will typically have a weight average molecular weight of from about 500 to about 10,000.

The chromophore can contain any suitable chromophore, which (i) can be grafted onto the polymer, (ii) has suitable radiation absorption characteristics, and (iii) does not adversely affect the performance of the material or any overlying photoresist material. Preferred chromophore moieties include chrysenes, pyrenes, fluoranthrenes, anthrones, benzophenones, thioxanthones, and anthracenes. Anthracene derivatives, such as those described in U.S. Pat. No. 4,371,605, the disclosure of which is incorporated herein by reference, can also be used. The chromophore 9-anthracene methanol is a preferred chromophore, particularly for 248 nm radiation.

Other chromophores suitable for this invention are described in U.S. Pat. No. 6,730,454; Japanese patent application 2004-158639; and Japanese patent application 2004-172222, the disclosures of which is incorporated herein by reference. An exemplary list include chromophores selected from the group consisting of phenyl, phenol, napathalene, and an unsaturated organic group. The use of a phenyl chromophore for 193 nm lithography exhibits certain advantages over some of the other chromophores listed. Also, for 193 nm lithography, non-aromatic compounds with one or more unsaturated carbon-carbon bonds can be used.

For 157 nm lithography, compounds containing saturated carbon-carbon bonds are generally preferred.

The chromophore can be chemically attached to the polymer by acid-catalyzed O-alkylation or C-alkylation such as by Friedel-Crafts alkylation. Alternatively, the chromophore can be chemically attached by esterification of an available hydroxyl group. For example, the chromophore can be attached via a hydroxyl-substituted aromatic group such as a hydroxybenzyl or hydroxymethylbenzyl group.

In some instances, the metal oxide polymeric unit can also function as a chromophore. For example, if the metal contains an optional ligand such as cyclopentadienyl, the resulting silicon-metal oxide polymer would will likely have an absorbance at a given radiation wavelength.

The selection of the organic transparent groups T will depend on the wavelength or character of the imaging radiation. In the case of 248 nm radiation, the organic transparent groups can include phenyl and phenol based substituents. In the case of 193 nm imaging radiation, the organic transparent groups are preferably bulky ($C_2$ or higher) organic radicals substantially free of unsaturated carbon-carbon bands. One preferred organic transparent group for 193 nm lithography is derived from an epoxy-based functional group. Other functional groups such as an alcohol, acetoxy, ester and/or ether based transparent groups can also be used. An exemplary list of organic transparent groups is described in U.S. Pat. No. 6,730,454; Japanese patent application 2004-158639; and Japanese patent application 2004-172222. The use of a cycloaliphatic epoxide as an organic transparent group for 193 nm lithography is particularly desirable. In many instances, the amount of transparent organic groups T are preferably balanced with the amount of chromophore R to provide a desired combination of energy absorption and antireflection character in the antireflective material.

In the case of 157 nm imaging radiation, the organic transparent groups are preferably fluorine-containing groups such as a trifluoromethyl group or a perfluoroalkyl. Again, the amount of transparent organic groups is preferably balanced with the amount of chromophore to provide a desired combination of energy absorption and antireflection character in the silicon antireflective material.

The silicon-metal oxide polymer can be crosslinked through reactive sites W in the polymer compositions with an external crosslinking agent as shown below.

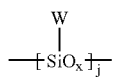

wherein W represents an organic group with a crosslinked site, and j>0. Alternatively, the polymer can include internal crosslinking groups, i.e., attached to one of the organic groups of the polymer, e.g., the chromophore or the organic transparent group.

The reactive site W comprises alcohols, more preferably aromatic alcohols (e.g., hydroxybenzyl, phenol, hydroxymethylbenzyl, etc.) or cycloaliphatic alcohols (e.g., cyclohexanoyl). Alternatively, non-cyclic alcohols such as fluorocarbon alcohols, aliphatic alcohols, amino groups, vinyl ethers, and epoxides can be used.

The external crosslinking agent can be one that reacts with the silicon-metal oxide polymer and is catalyzed by an acid and/or by heat. Generally, the crosslinking agent can be any suitable crosslinking agent known in the negative photoresist art which is otherwise compatible with the other selected components of the antireflective composition. Preferred crosslinking agents are glycoluril compounds such as tetramethoxymethyl glycoluril, methylpropyltetramethoxymethyl glycoluril, and methylphenyltetramethoxymethyl glycoluril, available as POWDERLINK® from Cytec Industries. Other possible crosslinking agents include: 2,6-bis(hydroxymethyl)-p-cresol compounds such as those found in Japanese Laid-Open Patent Application (Kokai) No. 1-293339, etherified amino resins, for example methylated or butylated melamine resins (N-methoxymethyl- or N-butoxymethyl-melamine respectively), and methylated/butylated glycolurils, as can be found in Canadian Patent No. 1 204 547. Other crosslinking agents such as bis-epoxies or bis-phenols (e.g., bisphenol-A) can also be used. Combinations of two or more crosslinking agents can also be used. Other crosslinking agents are described in U.S. Pat. No. 6,730,454; Japanese patent application 2004-158639; and Japanese patent application 2004-172222.

The crosslinking component can also comprise silanol groups present in the silicon-metal oxide polymer. The silanol groups can be formed during the synthesis of the silicon-metal oxide polymer. Crosslinking can be achieved by silanol condensation via a sol gel process when SiOH bonds condense to form SiOSi bonds. Alternatively, the SiOH groups can react with metal-OH groups of the inorganic unit to from SiOMetal bonds. The SiOSi and SiO-Metal bonds form a crosslinked polymer with or without the addition of an external crosslinking agent.

The antireflective compositions will likely contain an acid generator, which is used to catalyze the crosslinking of the polymer. The acid generator can be a compound that liberates acid upon thermal treatment. A listing of known thermal acid generators include 2,4,4,6-tetrabromocyclohexadienone, benzoin tosylate, 2-nitrobenzyl tosylate and other alkyl esters of organic sulfonic acids. Compounds that generate a sulfonic acid upon activation are generally suitable. Other suitable thermally activated, acid generators are described in U.S. Pat. Nos. 5,886,102 and 5,939,236; the disclosures of these two patents as related to the thermally activated, acid generating compounds are incorporated herein by reference.

If desired, a radiation-sensitive acid generator can be used as an alternative to a thermally activated acid generator or in combination with a thermally activated acid generator. Examples of suitable radiation-sensitive acid generators are described in U.S. Pat. Nos. 5,886,102 and 5,939,236, the disclosures of these two patents as related to radiation sensitive, acid generating compounds are incorporated herein by reference. Other radiation-sensitive acid generators known in the resist art can be used as long as they are compatible with the other components of the antireflective composition.

A acid generator of the formula below provides an antireflective material with optimal characteristics.

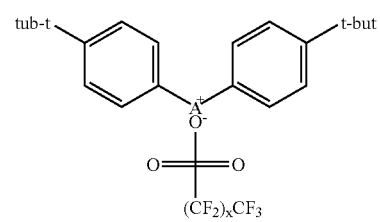

wherein A is S or I, and x is 0 to 7.

The antireflective compositions can contain (on a solids basis) (i) about 50-98 wt. % of the polymer, more preferably about 70-80 wt. %, (ii) about 1-50 wt. % of crosslinking agent, more preferably about 3-25 wt. %, and (iii) about 1-20 wt. % acid generator, more preferably about 1-15 wt. %.

The antireflective compositions will generally contain a solvent prior to application. The solvent may be any solvent conventionally used with resists which otherwise does not have any excessively adverse impact on the performance of the antireflective composition. Exemplary solvents include propylene glycol monomethyl ether acetate, cyclohexanone, and ethyl lactate. The compositions can also contain small amounts of auxiliary components (e.g., base additives, etc.) known in the art.

The antireflective compositions can be prepared by combining the silicon-metal oxide polymer of Formula I, crosslinking agent and acid generator, and any other desired ingredients (e.g., solvent) using conventional methods. The antireflective compositions can be deposited by spin-coating and subsequently cured. At times in this application, applicants refer to a cured antireflective composition of the invention as a silicon-metal oxide, antireflective material. In particular, this latter term is used to distinguich the antireflective material of the invention to other antireflective materials in a lithographic structure. One method used to cure the antireflective compositions is by heating the deposited composition to achieve crosslinking and solvent removal. The heating is preferably conducted at about 250° C. or less, more preferably about 150° C. to 220° C. The heating time will depend on the material thickness and temperature.

The antireflective material is optically tuned by careful selection of the chromophore R and the organic transparent group T of the polymer. The antireflective material can provide a semiconductor structure with excellent antireflective properties at 193 nm radiation, in particular at high NA lithography.

The antireflective material can have a thickness from 30 nm to 300 nm. In many instances, the antireflective material will have a thickness from 30 nm to 150 nm.

In one embodiment, an organic antireflective material known in the lithographic art can be used in combination with the silicon-metal oxide, antireflective material. The organic antireflective material can be prepared from any polymer containing the elements of carbon, hydrogen, oxygen and nitrogen and mixtures thereof that can be spin applied and crosslinked. A variety of organic antireflective compositions known in the lithographic art such as organic BARCs or as planarizing undermaterials in bimaterial or other multimaterial lithographic schemes can be used. The choice of the appropriate organic antireflective composition will depend upon the desired optical constants. Examples of suitable organic antireflective compositions are described in U.S. Pat. Nos. 6,503,689; 6,410,209; 6,686,124; and U.S. published application 20020058204A1, the entire disclosures of which are incorporated herein by reference.

The selection of which organic antireflective polymer composition to use will depend on several characteristics such as solubility, optical properties, thermal properties, mechanical properties, etch selectivity, and film forming ability. The resulting organic antireflective material will be suitable for low-wavelength radiation. Like the silicon-metal oxide polymer of Formula I, the organic antireflective material can have a plurality of different chemical groups each having a specific function in the overall performance of the material. Optical properties, mode of insolubilization, solubility enhancement, and etch resistance are among the properties that can be tailored by a judicious selection of the chemical groups.

Examples of suitable organic polymers that can be used include poly(4-hydroxystyrene), copolymers of 4-hydroxystyrene such as with up to 40 weight % of an alkyl methacrylate, alkylacrylate and/or styrene; novolac resins, acrylate polymers, methacrylate polymers, fluorocarbon polymers, and cycloaliphatic polymers such as norbornene-based and maleic anhydride polymers. Some examples of specific polymers include poly(3-hydroxystyrene), poly(acrylic acid), poly(norbonene carboxylic acid), copolymer of (4-hydroxystyrene and styrene), copolymer of 4-hydroxystyrene and acrylic acid, copolymer of styrene and acrylic acid, and copolymer of norbonene and maleic anhydride.

The lithographic structures comprising the antireflective material and organic antireflective material will likely exhibit excellent reflectivity control in particular at 193 nm lithography with a numerical aperture greater than 0.75 NA. The lithographic structures will have wide optical tunability, where the index of refraction (n), and extinction coefficient (k), can be varied by providing the appropriate optical properties of the silicon-metal oxide, antireflective material and the organic antireflective material. The chromophore and organic transparent groups are selected to achieve the appropriate index of refraction (both real and imaginary; n and k respectively) for a particular application at 248 nm, 193 nm or 157 nm wavelengths.

The thickness of the silicon-metal oxide, antireflective material and organic antireflective material depends upon the desired function. For most applications, the thickness of the silicon-metal oxide, antireflective material is typically about 20 nm to 100 nm. For many such applications, the thickness of the silicon-metal oxide, antireflective material is from about 25 nm to 60 nm. To achieve complete planarization the desired film thickness of the organic antireflective material for most applications is typically about 100 nm to 500 nm. For many such applications, the thickness of the organic antireflective material is from about 125 nm to 250 nm In one embodiment, the silicon-metal oxide, antireflective material has a thickness $T_k$ and the organic antireflective material has a thickness from $2T_k$ to $8T_k$, wherein the thickness $T_k$ is in nanometers.

The lithographic structures that combine a silicon oxide, antireflective material and an organic antireflective material, and the associated advantages to such structures are described in a copending U.S. patent application, titled "Process of Making a Lithographic Structure Using Multiple Antireflective Materials," the entire disclosure of which is incorporated herein by reference. Similar, if not the same, advantages are achievable with the lithographic structures of this invention, which include a silicon-metal oxide, antireflective material and an organic antireflective material.

The invention is also directed to a process of making a lithographic structure comprising:

providing a substrate;

depositing an antireflective composition on the substrate; wherein the antireflective composition comprises a polymer of formula I,

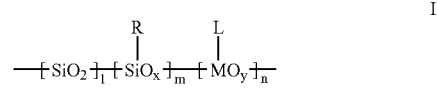

wherein $1 \leq x \leq 2$; $1 \leq y \leq 5$; $1 \geq 0$; m>0; n>0; R is a chromophore, M is a metal selected from Group IIIB to Group VIB, lanthanides, Group IIIA, Group IVA except silicon; and L is an optional ligand, and curing the deposited antireflective composition to form an antireflective material;

depositing a photoresist on the antireflective material, pattern expose the photoresist to radiation and remove portions of the photoresist and the antireflective material to expose portions of the substrate; and etching the exposed portions of the substrate.

The antireflective composition is applied to a substrate and cured. The substrate can be a dielectric or metal material, or the described organic antireflective material. A radiation-sensitive photoresist is then deposited on the antireflective material.

The antireflective material can be used in combination with a variety of different known photoresists. A photoresist that can be imaged with 248 nm radiation, 193 nm radiation, 157 nm radiation or electron beam radiation is particularly suited for the antireflective material. Known photoresist materials are described, for example, in U.S. Pat. No. 6,037,097 to Bucchignano et al., the disclosure of which is related to the photoresist materials is incorporated herein by reference.

Like the antireflective material, the solvent-containing photoresist composition can be applied using spin coating or some other technique known to those of ordinary skill in the art. The photoresist coating is then typically heated (pre-exposure baked) to remove the solvent and improve the coherence of the photoresist material. The pre-exposure bake temperature can vary depending on the glass transition temperature of the photoresist. The thickness of the photoresist is preferably designed as thin as possible with the provisos that the thickness is substantially uniform and that the photoresist material be sufficient to withstand subsequent processing (typically reactive ion etching) to transfer the lithographic pattern.

After solvent removal, the photoresist is then patternwise-exposed to the desired radiation (e.g. 193 nm ultraviolet radiation). Where scanning particle beams such as electron beam are used, patternwise exposure can be achieved by scanning the beam across the substrate and selectively applying the beam in the desired pattern. If ultraviolet radiation is used, the patternwise exposure is conducted through a mask which is placed over the resist material. For 193 nm UV radiation, the total exposure energy is about 100 millijoules/cm² or less, or about 50 millijoules/cm² or less (e.g. 15-30 millijoules/cm²).

After the desired patternwise exposure, the photoresist is typically baked to further complete the acid-catalyzed reaction and to enhance the contrast of the exposed pattern. The post-exposure bake is preferably conducted at about 60° C.-175° C., more preferably about 90° C.-160° C. The post-exposure bake is preferably conducted for about 30 seconds to 5 minutes. After post-exposure bake, the photoresist with the desired pattern is developed by contacting the exposed photoresist to an alkaline solution which selectively dissolves the areas of the resist which were exposed to the radiation. Preferred alkaline solutions (developers) are aqueous solutions of tetramethyl ammonium hydroxide. The resulting lithographic structure on the substrate is then typically dried to remove any remaining developer solvent.

One advantage provided by the antireflective material is that by optimizing the RIE condition using a reactive ion plasma consisting of C, F, H, N, S, O and mixtures thereof, excellent selectivity between the antireflective material and the underlying substrate, e.g., a dielectric, can ensure good pattern transfer.

In one embodiment, the proper pattern transfer based on the etch selectivity between photoresist, antireflective material and substrate can be achieved as follows. By using a fluorocarbon plasma, e.g., $CF_4/O_2$, a reactive ion etch (RIE) process, pattern transfer from the photoresist into the antireflective material is established without consuming much of the photoresist. The high etch selectivity in combination with choosing the appropriate thickness for the antireflective material enables the use of relatively thin photoresists. The pattern is then transferred into the underlying substrate. The presence of the metal-oxide units in the antireflective material provides in-part the good selectivity between the antireflective material and the substrate. The remaining antireflective material can then be removed by methods known to those in the art. If the substrate is a low k silicon based dielectric, the antireflective material can be removed by a wet strip that contains fluoride or tetramethyl- or ammonium hydroxide.

The lithographic structure can be used to create patterned structures such as metal wiring lines, holes for contacts or vias, insulation sections (e.g., damascene trenches or shallow trench isolation), trenches for capacitor structures, etc, as might be used in the design of integrated circuit devices. The antireflective material is especially useful in the context of creating patterned materials of substrates such as oxides, nitrides or polysilicon.

Examples of general lithographic processes where the antireflective material can be useful are disclosed in U.S. Pat. Nos. 4,855,017; 5,362,663; 5,429,710; 5,552,801; 5,618,751; 5,744,376; 5,801,094; 5,821,469 and 5,948,570. Other examples of pattern transfer processes are described in Chapters 12 and 25 of "Semiconductor Lithography, Principles, Practices, and Materials" by Wayne Moreau, Plenum Press, (1988), the disclosure of which is incorporated herein by reference. It should be understood that the invention is not limited to any specific lithographic technique or device structure.

EXAMPLE 1

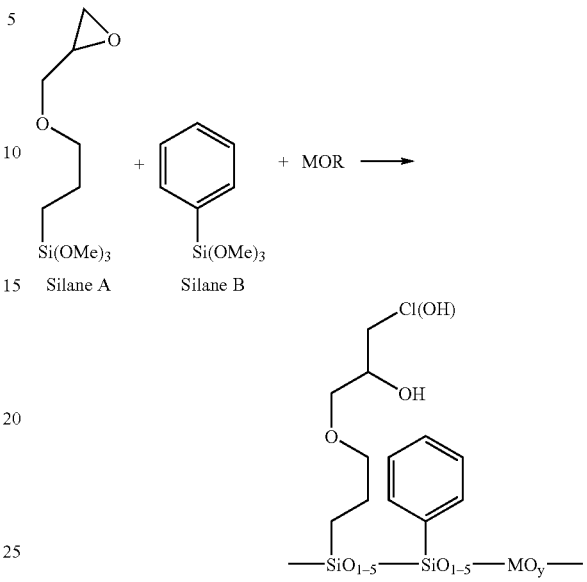

EXAMPLE 1A

Silane A (0.381 g, 0.45 mol %), Silane B (0.069 g, 0.1 mol %) and Ti(On-Bu)₄ (0.549 g, 0.45 mol %) was added to a reaction vial with Dowanol PM (Aldrich, 4 g). The solution mixture is stirred at room temperature for about 5 min, followed by the dropwise addition of 1N HCl (1 g). The resulting clear solution is stirred at room temperature for 1 hr, then filtered through a 0.2 micron membrane. The filtered solution is applied to a silicon wafer that is spun at 3000 rpm for 60 sec. The deposited composition is heated at 215° C. for 2 min.

The optical constants of the resulting silicon-metal oxide, antireflective material were measured using an n & k analyzer. Index of refraction (n)=1.735 and extinction coefficient (k)=0.301 at 193 nm. The material had a thickness of 233 nm.

Ruthorford Back Scattering was used to analyze the atomic percent (at % ±2%) composition of the film.

| Si | O | C | H | Cl | Ti |
|---|---|---|---|---|---|
| 6.1 | 19.3 | 30.1 | 37.3 | 2.9 | 24.3 |

EXAMPLE 1B

The same reaction and application of the filtered solution was used as in Example 1A except that the reaction mixture comprising Silane A (0.444 g), Silane B (0.081 g), and Ge(OEt)₄ (0.549 g).

The optical constants of the resulting silicon-metal oxide, antireflective material were measured using an n & k analyzer. Index of refraction (n)=1.725 and extinction coefficient (k)=0.294 at 193 nm. The material had a thickness of 307 nm.

Ruthorford Back Scattering was used to analyze the atomic percent (at % ±2%) composition of the film.

| Si | O | C | H | Cl | Ge |
|---|---|---|---|---|---|
| 6.1 | 18.9 | 27 | 40.9 | 2.9 | 24.2 |

EXAMPLE 2

Lithography (193 nm):

The silicon-metal oxide, antireflective material described in Example 1A was used for lithography. A material of acrylic-based photoresist, a product of JSR microelectronics, was spin-coated over the silicon-metal oxide, antireflective material to a thickness of about 250 nm. The radiation-sensitive imaging material was baked at 130° C. for 60 seconds. The radiation-sensitive imaging material was then imaged using a 0.75 NA 193 nm ASML Stepper with conventional and annular illumination using APSM reticle. After patternwise exposure, the radiation-sensitive imaging material was baked at 130° C. for 60 seconds. The image was then developed using a commercial developer (0.26M TMAH). The resulting pattern showed 120 nm contact holes and 113.75 nm lines and 104 nm space patterns.

Pattern Transfer by Reactive Ion Etching:

The contact hole and lines and space pattern formed on the silicon-metal oxide, antireflective material were transferred into silicon oxide by a 20 second fluorocarbon-based etch using a LAM RIE tool. The observed etch selectivity of antireflective hardmask composition to the resist was approximately 2:1. The etch rate of blanket films from example 1A in $CHF_3/CH_4$ plasma is 613 Å/min (silicon oxide etch rate 2000 Å/min), in chlorine 813 Å/min and $N_2/H_2$ 62 Å/min.

Stripping the Silicon-Metal Oxide, Antireflective Materials by a Wet Strip):

The silicon-metal oxide, antireflective materials described in Examples 1A and 1B were stripped in HF/ethylene glycol (2 ml 49% HF in 250 mL ethylene glycol) at 60° C. and AZ400T, which is commercially available from Clariant, at 80° C. in 5 min dip.

We claim:

1. A composition comprising a polymer of formula I,

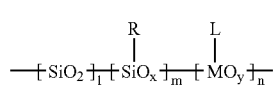

I wherein $1 \leq x \leq 2$; $1 \leq y \leq 5$; $1 \geq 0$; $m \geq 0$; $n \geq 0$; R is a chromophore, M is a metal selected from Group IIIB to Group VIB, lanthanides, Group IIIA, Group IVA except silicon; and L is an optional ligand and wherein the amount of chromophore R is about 5 mol % to about 30 mol % based upon the mole sum of 1+m.

2. The composition of claim 1, wherein the polymer of formula I further comprises the monumeric unit

wherein k>0 and T is an organic transparent group substantially transparent to 248 mm 193 nm or 157 nm radiation.

3. The composition of claim 1 wherein L is present in the polymer of formula I and L is selected from the group consisting of -oxo, -acetoacetato, —$R^1$, —$OR^1$ and mixtures thereof, wherein $R^1$ is a $C_1$-$C_6$ alkyl, or a substituted or unsubstituted phenyl or cyclopentadienyl.

4. The composition of claim 1 wherein L is present in the polymer of formula I and wherein the chromophore R is selected from the group consisting of phenyl, phenol, napathalene, and an unsaturated organic group.

5. The composition of claim 2 wherein the transparent organic group T in the polymer of formula I includes a crosslinkable epoxide.

6. The composition of claim 1 further comprising a thermal acid generator.

7. A silicon-metal oxide, antireflective material comprising a polymer of formula II,

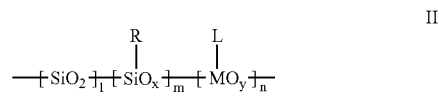

II wherein $1 \leq x \leq 2$; $1 \leq y \leq 5$; $1 \geq 0$; $m \geq 0$; $n \geq 0$; R is a chromophore, M is a metal selected from Group IIIB to Group VIB, lanthanides, Group IIIA, Group IVA except silicon; and L is an optional ligand and wherein the amount of chromophore is about 5 mol % to about 30 mol % based upon the mole sum of 1+m.

8. The antireflective material of claim 7 wherein the polymer of formula II further comprises

wherein k>0 and T is an organic transparent group substantially transparent to 248 nm, 193 nm or 157 nm radiation.

9. The antireflective material of claim 7 wherein L is present in the polymer of formula II and wherein L is selected from the group consisting of -oxo, -acetoacetato, —$R^1$, —$OR^1$ and mixtures thereof, wherein $R^1$ is a $C_1$-$C_6$ alkyl, or a substituted or unsubstituted phenyl or cyclopentadienyl.

10. The antireflective material of claim 7 wherein the chromophore R in the polymer of formula II is selected from the group consisting of phenyl, phenol, napthalene, and an unsaturated organic group.

11. The antireflective material of claim 8 wherein the transparent organic group T in the polymer of formula II includes a crosslinked site derived from the reaction of an organic functional group selected from an epoxide, alcohol, acetoxy, ester or ether.

12. The antireflective material of claim 8 wherein the transparent organic group T in the polymer of formula II includes a crosslinked site derived from the reaction of a epoxide.

13. The antireflective material of claim 7 wherein the amount of silicon in the polymer of formula II is from about 3 at % to about 15 at %, and the amount of oxygen is from about 12 at % to about 30 at %, of the total atomic percent composition.

14. The antireflective material of claim 7 wherein the metal M in the polymer of formula II is selected from Group IVB, Group VB or germanium.

15. A silicon-metal oxide, antireflective material comprising a polymer of formula II,

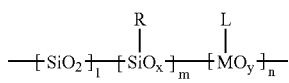

II wherein $1 \leq x \leq 2$; $1 \leq y \leq 5$; $1 \geq 0$; $m \geq 0$; $n \geq 0$; R is a chromophore M is a metal selected from Group IIIB to Group VIB, lanthanides, Group IIIA Group IVA except silicon and L is an optional ligand, wherein the amount of chromophore is about 5 mol % to about 30 mol % based upon the mole sum of l+m and wherein the polymer of formula II further comprises

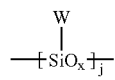

and wherein W represents an organic group with a crosslinked site, and j>0.

16. A process of making a lithographic structure comprising:
providing a substrate;
depositing an antireflective composition on the substrate; wherein the antireflective composition comprises a polymer of formula I,

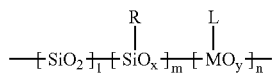

I wherein $1 \leq x \leq 2$; $1y \leq 5$; $1 \geq 0$; $m \geq 0$; $n \geq 0$; R is a chromophore, M is a metal selected from Group IIIB to Group VIB, lanthanides, Group IIIA, Group IVA except silicon; and L is an optional ligand, and curing the deposited antireflective composition to form a silicon-metal oxide, antireflective material;
depositing a photoresist on the silicon-metal oxide, antireflective material, pattern expose the photoresist to radiation and remove portions of the photoresist and the silicon-metal oxide, antireflective material to expose portions of the substrate; and
etching the exposed portions of the substrate.

17. The method of claim 16 wherein removing portions of the photoresist and the silicon-metal oxide, antireflective material is accomplished by reactive ion etching.

18. The method of claim 16 wherein the remaining portion of the photoresist is removed prior to the etching of the exposed portions of the substrate.

19. The method of claim 18 wherein the remaining portion of the silicon-metal oxide, antireflective material is removed by a wet strip following the etching of the exposed portions of the substrate.

20. The method of claim 19 wherein the substrate is a low k dielectric containing silicon.

21. The method of claim 20 wherein the substrate is an organic antireflective material.

22. The method of claim 21 wherein the silicon-metal oxide, antireflective material has a thickness $T_k$ and the organic antireflective material has a thickness from $2T_k$ to $8T_k$, wherein the thickness $T_k$ is in nanometers.

23. The method of claim 16 wherein depositing the antireflective composition on the substrate comprises the addition of an acid generator.

24. The method of claim 23 wherein the acid generator is of formula

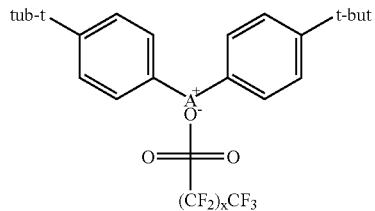

wherein A is S or I, and x is 0 to 7.

* * * * *